(12) United States Patent  
Giles

(10) Patent No.: US 6,963,137 B2  
(45) Date of Patent: Nov. 8, 2005

(54) LOW DIELECTRIC CONSTANT LAYERS

(75) Inventor: Kathrine Giles, Gloucestershire (GB)

(73) Assignee: Trikon Holdings Limited, Newport (GB)

( * ) Notice: Subject to any disclaimer, the term of this patent is extended or adjusted under 35 U.S.C. 154(b) by 0 days.

(21) Appl. No.: 10/482,971

(22) PCT Filed: Jul. 15, 2002

(86) PCT No.: PCT/GB02/03231

§ 371 (c)(1),  
(2), (4) Date: Jan. 7, 2004

(87) PCT Pub. No.: WO03/009364

PCT Pub. Date: Jan. 30, 2003

(65) Prior Publication Data

US 2004/0207083 A1     Oct. 21, 2004

(30) Foreign Application Priority Data

Jul. 18, 2001 (GB) .................................... 0117460  
Oct. 11, 2001 (GB) .................................... 0124356

(51) Int. Cl.⁷ .......................... H01L 23/48; H01L 29/40
(52) U.S. Cl. ................... 257/759; 257/632; 257/642
(58) Field of Search ............................. 257/758–760, 257/632, 638, 642; 438/623, 787, 778–780

(56) References Cited

U.S. PATENT DOCUMENTS

| | | | |
|---|---|---|---|
| 5,561,318 A | | 10/1996 | Gnade et al. |
| 6,153,528 A | * | 11/2000 | Lan ............................. 438/697 |
| 6,376,859 B1 | * | 4/2002 | Swanson et al. .............. 257/49 |
| 6,465,365 B1 | * | 10/2002 | Annapragada ............... 438/763 |
| 6,593,251 B2 | * | 7/2003 | Baklanov et al. ........... 438/778 |
| 6,800,928 B1 | * | 10/2004 | Lee et al. .................... 257/632 |

FOREIGN PATENT DOCUMENTS

| | | |
|---|---|---|
| EP | 0 687 004 A1 | 12/1995 |
| EP | 0 881 678 A2 | 12/1998 |
| EP | 881678 A2 * | 12/1998 ......... H01L 23/532 |
| WO | WO 98/50945 | 11/1998 |

\* cited by examiner

*Primary Examiner*—Jerome Jackson  
*Assistant Examiner*—Matthew E. Warren  
(74) *Attorney, Agent, or Firm*—Volentine Francos & Whitt, PLLC

(57) ABSTRACT

This invention relates to low dielectric constant layers formed on the substrate having:
  (a) a base zone, adjacent the substrate, having pores distributed therein, at least the majority of the pores having diameters in the range 1 to 10 nm;
  (b) an atomically smooth surface zone, spaced from the substrate; and
  (c) an intermediate zone having pores distributed therein, at least the majority of the pores having diameters equal to or less than 2 nm so that there is a general reduction in pore size from the bottom of the layer towards the top.

19 Claims, 4 Drawing Sheets

Sample 1 Modulus and Hardness Plot (K=2.2-2.4)

Modulus: 6.51 Gpa(±0.37) Hardness: 1.23 GPa±0.20 at minimum depth = 90nm

4MS (Tetra-methylsilane)+$O_2$ + $N_2$ deposited at 30°C followed by a 30 minutes $H_2$ Plasma anneal at 400°C

K-Value variation with H2 plasma treatment time of Orion films

| Thickness (A) | treatment time (secs) | K-Value after Standard Etchback (30 secs C3F8-30nm) |||||| |
|---|---|---|---|---|---|---|---|---|
| | | Point1 | Point2 | Point3 | Point4 | Point5 | Average | Error |
| 3021 | 90 | 2.575 | 2.594 | 2.628 | 2.628 | 2.605 | 2.606 | 0.873776 |
| 3149 | 135 | 2.606 | 2.636 | 2.669 | 2.643 | 2.634 | 2.6376 | 0.853932 |
| 3008 | 180 | 2.689 | 2.735 | 2.755 | 2.788 | 2.762 | 2.7458 | 1.346873 |
| 2948 | 225 | 2.814 | 2.823 | 2.843 | 2.907 | 2.858 | 2.849 | 1.287506 |
| 3070 | 360 | 2.834 | 2.87 | 2.863 | 2.874 | 2.895 | 2.8672 | 0.769436 |
| 6109 | 270 | 2.158 | 2.198 | 2.204 | 2.24 | 2.2 | 2.2 | 1.322095 |
| 6303 | 360 | 2.133 | 2.174 | 2.205 | 2.207 | 2.177 | 2.1792 | 1.377569 |
| 6270 | 450 | 2.156 | 2.163 | 2.166 | 2.137 | 2.147 | 2.1538 | 0.552687 |
| 10430 | 450 | 2.292 | 2.264 | 2.293 | 2.322 | 2.322 | 2.2986 | 1.058337 |
| 10342 | 600 | 2.225 | 2.257 | 2.311 | 2.25 | 2.257 | 2.26 | 1.389409 |
| 10761 | 750 | 2.229 | 2.237 | 2.213 | 2.251 | 2.244 | 2.2348 | 0.656421 |

*Fig. 4*

LOW DIELECTRIC CONSTANT LAYERS

BACKGROUND OF THE INVENTION

This invention relates to a low dielectric constant (k) layers.

As is well known in the semi-conductor art as the geometry shrinks, there is a need to reduce the dielectric constant of the inter-metal dielectric layers, in particular, and also in the layers used for shallow trench isolation. U.S. Pat. Nos. 6,171,945 and 6,054,206 each describe methods of reducing the effective dielectric constant of a deposited layer below that of the material from which it is formed. In each case voids are created within the material by the removal of atomic or molecular material. However such materials are difficult to use with, for example, chemical mechanical polishing because they have a low mechanical strength at their surface and may simply break up under the polishing process and further their surface porosity is a problem because chemical mechanical polishing, and indeed other cleaning processes, are wet. The porosity also provides a rough surface. Proposals have been made to overcome these problems by capping the layer, but such capping layers may de-laminate under the force of chemical mechanical polishing and because of their increased density, they may negate much of the reduction in k value achieved by creating a porous structure. Embodiments of the applicant's invention, mitigate at least a number of these problems.

SUMMARY OF THE INVENTION

The present invention consists in a layer of dielectric material formed on a substrate having:
(a) a base zone, adjacent the substrate, having pores distributed therein, the majority of the pores having diameters in the range 1 to 10 nm;
(b) an atomically smooth surface zone spaced from the substrate and
(c) an intermediate zone having pores distributed therein, at least the majority of the pores having diameters <2 nm;

so that there is a general reduction in pore size from the bottom of the layer towards the top.

The applicants have discovered that, surprisingly, this approach can result not only in extremely low k values (a value of 1.85 has been achieved), but also the atomically smooth surface provides a hard layer, suitable for chemical mechanical polishing, which is also smooth. As the theory, as set out in the above mentioned U.S. Patents, is that the more voids that one can get into the layer, the greater the reduction in dielectric constant, the success of the applicants approach is both surprising and counter intuitive.

It is particularly preferred that the pores in the intermediate and/or base layer have a smaller diameter the nearer they are to the surface and it will be understood that with this graded approach, there is no hard and fast boundary between the zones. In at least some experimentally preferred layers, it is estimated that the surface zone occupies in the region of 10% of the depth of the layer; the intermediate layer occupies in the region of 40% of the depth and the base zone occupies in the region of 50% of the depth.

The pores in the base zone preferably have diameters in the range of 1 to 4 nm with a typical value of 3 nm, whilst the pores in the intermediate zone preferably have diameters of <1 nm. The surface zone may have a surface height variation of about 2.4 to 4.0 Å where the atomic spacing is about 2 Å.

The layer preferably has a dielectric constant <2.5, when typically the dielectric constant of the material in a fully dense form is greater than 2.5.

The dielectric material may be an organo silicon dioxide type and specifically it may be a carbon containing hydrogenated silicon dioxide type. Such films can be formed in many ways, but, by way of example, one such method is described in WO 99/60621 the contents of which are hereby incorporated by reference. In that case the layer is chemically vapour deposited and it is preferred that the layers be formed by a low temperature CVD process.

The graded porosity described above, may be achieved in any suitable manner, but it is preferred that the layer is a single integral layer without any boundaries or laminations. One method that the applicants have identified is to expose the deposited layer to a hydrogen containing plasma. This approach seems to have wide applicability, although it may not work for every type of film. By way of example a 500 nm film formed from a reaction of tetramethylsilane and oxygen maybe treated by a hydrogen plasma for five minutes to achieve the required porosity.

It is particularly preferred that the hardness at the surface is greater than the hardness of the intermediate zone.

The invention also consists in a semi-conductor device incorporating a layer as defined above, in which case the layer may form part of a dual damascene structure, for example where the metalisation in the structure is principally copper.

The invention also includes a method of forming a layer as defined above including the steps of chemically vapoured depositing an organo silicon dioxide type material and exposing it to a predominantly hydrogen containing plasma.

Although the invention has been defined above it is to be understood that it includes any inventive combination of the features set out above or in the following description.

BRIEF DESCRIPTION OF THE DRAWINGS

The invention may be performed in various ways and specific embodiments will now be described, by way of example with reference to the accompanying drawings, in which:

FIG. 4 is a table of k values for 3 thickness, a nominal 3,000 Å, 6,000 Å and 10,000 Å and varying treatment times.

DETAILED DESCRIPTION OF THE PREFERRED EMBODIMENTS

Figure 1:
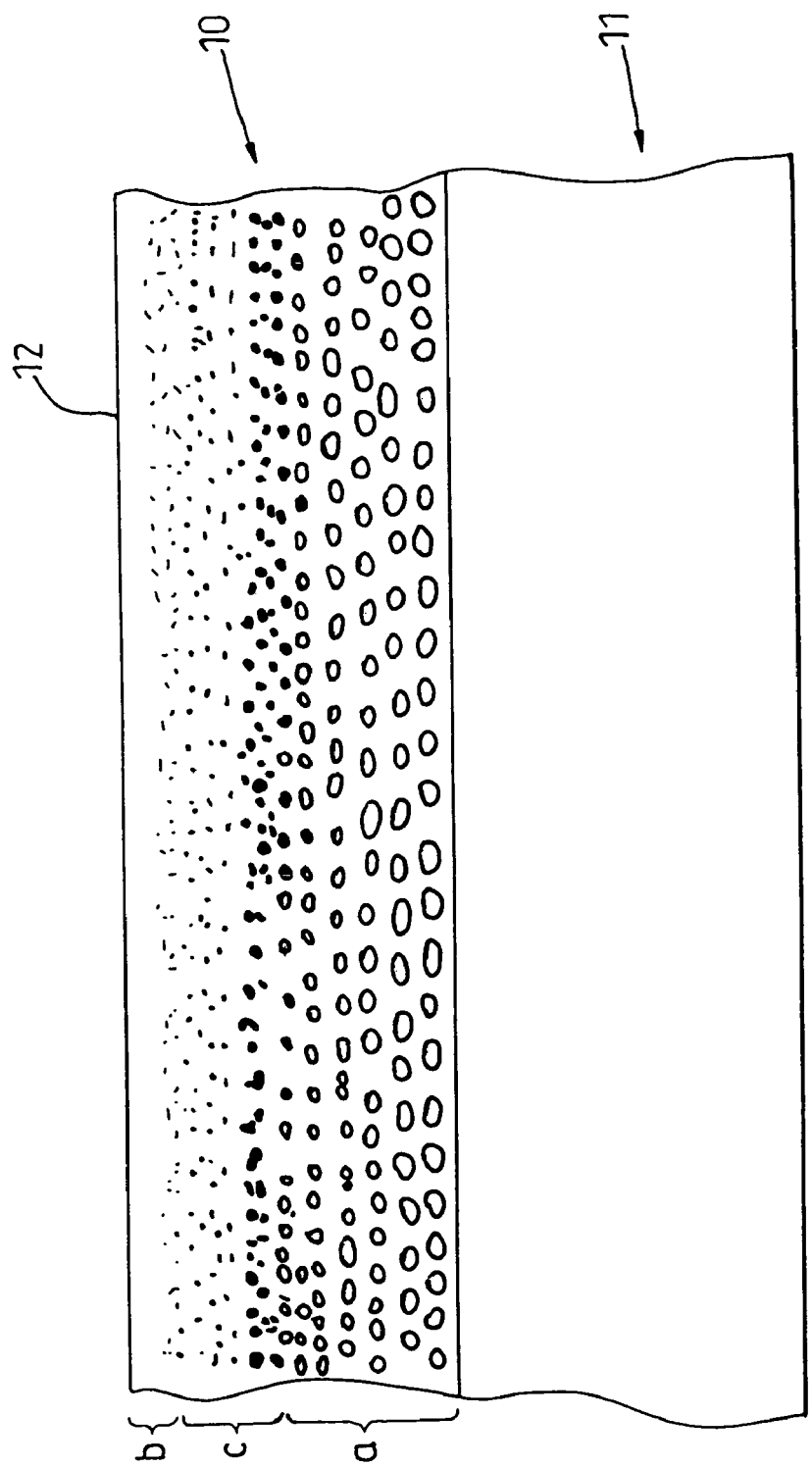
FIG. 1 is a schematic cross-section of a layer deposited on the substrate.

In FIG. 1, a layer 10 has been deposited on a substrate 11, the upper surface of which may be the substrate e.g. silicon of a silicon wafer or may be part of an interconnect layer deposited upon it. As can be seen the layer 10 has a graded porosity from top to bottom with a base zone (a) in which the pore sizes are in the range 1 to 10 nm, an atomically smooth surface zone (b) and an intermediate zone (c) in which the pore sizes have diameters of less than 2 nm. It will be appreciated that when one refers to pore sizes it is the majority of the pores that are being referred to in any particular zone and it will also be understood that there is no hard transition from one zone to another in the described embodiment. This is preferable, because it leads to a progressive change in mechanical properties and hence reduces the likelihood of delamination, for example under the forces of chemical mechanical polishing.

In a particular experiment such a layer was deposited by reacting tetramethylsilane and oxygen, which was in a carrier gas $N_2$, at a substrate temperature of 30° C. The deposited film was then treated to a $H_2$ plasma at 400° C. for a time dependent on the film thickness. For layers of 500 nm and thicker generally 1 minute per 100 nm is sufficient, though longer times were initially experimented with. TEM analysis showed pores of the order of 4 nm, at the bottom of the film, which decreased in size to 1 nm in the intermediate zone and then became invisible. The height variations in the surface 12 were measured as being between 2.4 Å to 4.0 Å (measured by atomic force microscopy) where the atomic spacing was 2 Å. The surface 12 is therefore to all intents and purposes atomically smooth.

It becomes progressively more difficult to measure k values as the k value drops, but measurements in the range of 1.85 to 2.25 have been achieved. The lower figure in particular is lower than any that have been reported in this field.

Figure 2:
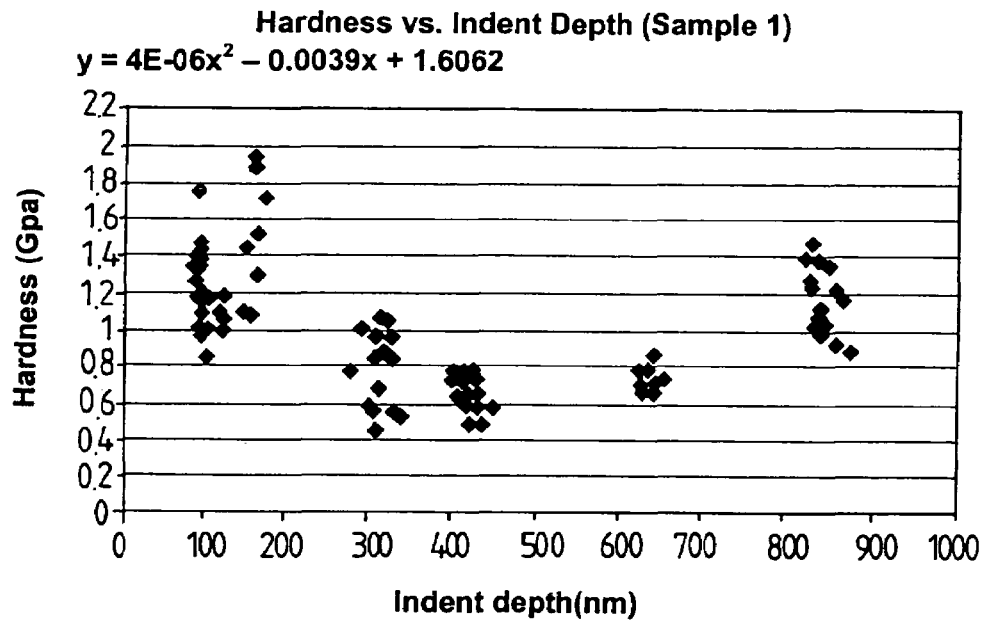
FIG. 2 is a plot of hardness against indent depth on a sample layer.

In FIG. 2 the hardness of the film is plotted against indent depth, where a probe is being applied to the film in accordance with the standard hardness test. This shows that at the surface the hardness is at least 1.2 GPa, but reduces as the indent probe pushes into the film before increasing again as a result of the hardness of the underlying substrate 11.

Figure 3:
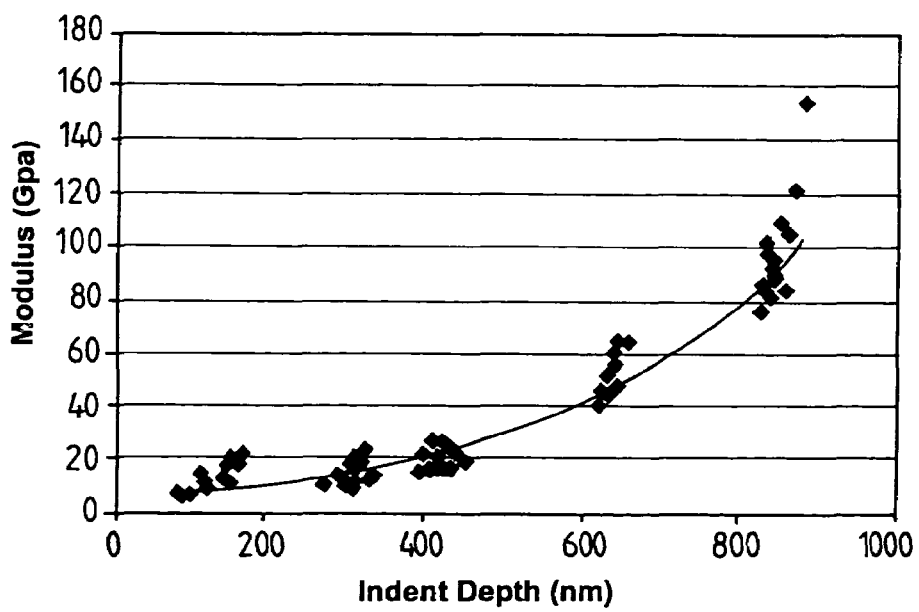
FIG. 3 is a plot of modulus against indent depth.

In FIG. 3 there is a similar plot for modulus. Modulus is the linear slope of a stress vs strain curve and can be found by plotting the values of loading and unloading during hardness tests. The modulus of thermal silicon dioxide is 78 GPa. In the present case the modulus at 90 nm film thickness is about 6.51 GPa. The prior art materials mentioned above have a modulus of less than 3 GPa.

Hydrogen plasma treatment creates a surface 'crust' of higher k value. This has been found to typically be 20 nm thick, such that an 'as treated' 300 nm layer has a k value of 2.8 and after a 30 nm etch back has a k value of 2.6. This etch back is typically a 30 second process using $C_3F_8$. This surface is not the surface zone of the invention and may preferably be removed.

Initially it was thought that treatment times for hydrogen plasma needed to be long e.g. 30 minutes. However it has been found that for typical film thicknesses about 1 minute per 100 nm is sufficient to achieve the object of the invention. For very thin films it has been found thus far that the k value has not been reduced by the hydrogen plasma treatment and it is believed that this is because the resultant film does not contain a porous layer of this invention. The film as deposited in these particular experiments contains O—H and it is believed that these thin layers allows sufficient diffusion to disable the porosity mechanism of this particular process. See FIGS. 4 and 5.

Figure 5:
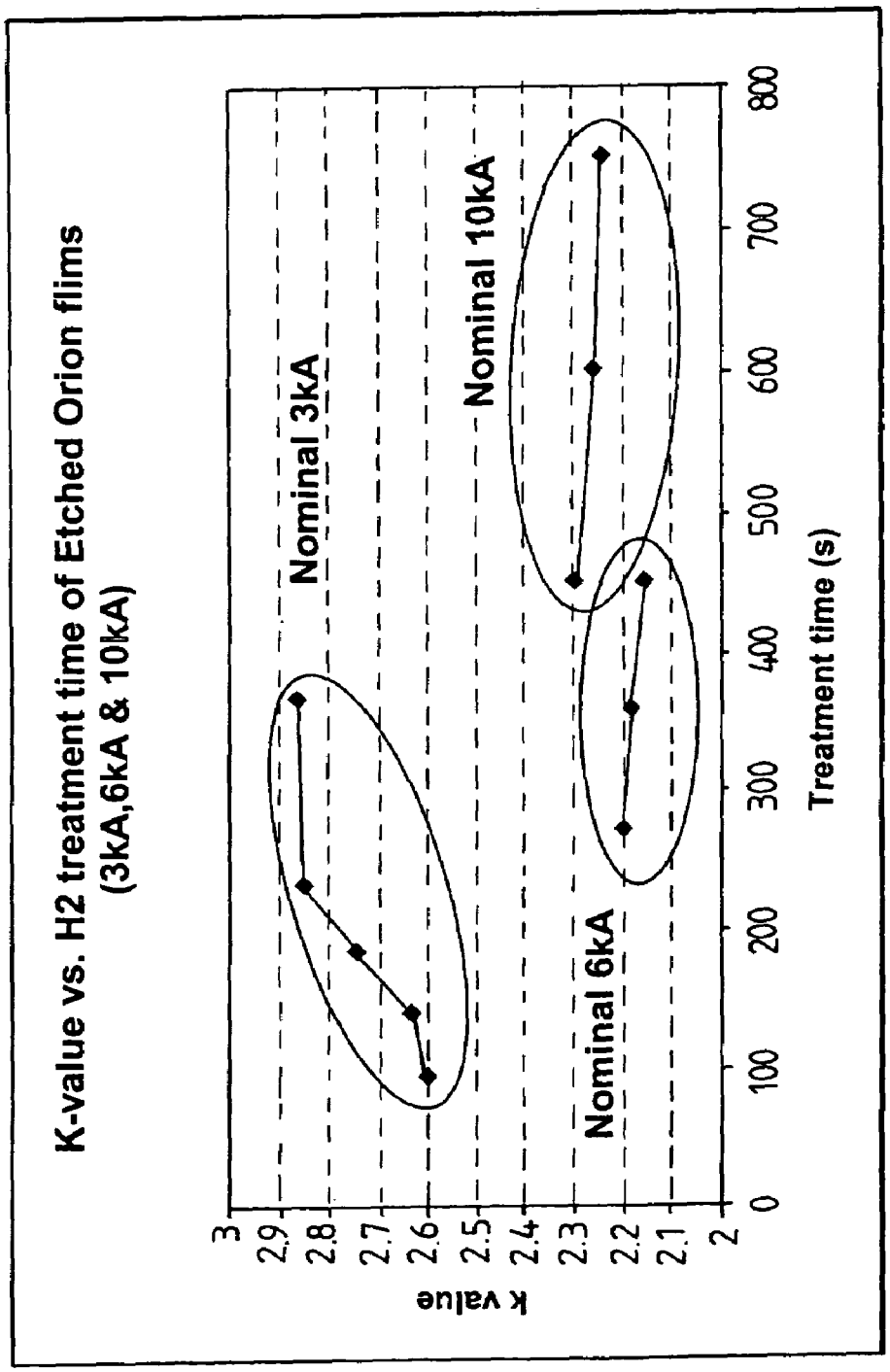
FIG. 5 is a graph indicating the same data as in FIG. 4.

In FIG. 4, k values have been measured for 3 nominal film thicknesses and varying treatment times on each film thickness at various points on a wafer, the surface crust having been etched away as described above. In FIG. 5 this same data is presented graphically.

As can be seen films of 1,000 nm (=10,000 Å) and 600 nm achieve very low k values after about 1 minute per 100 nm of film thickness, however for a 300 nm film the k value is not reduced by the hydrogen treatment, but rather it is increased, presumably by further densification as is known in the prior art. Thus to achieve ultra low k value very thin films, a thicker film is deposited and part of the upper layer(s) is etched away. Experimentally it has been found possible to reproduce low k films of 300 nm by deposited and treating a 500 nm thick film, and then etching back the top 200 nm. A film of this type had a k value at 500 nm thick of 2.4 and when etched back to 300 nm had a k value of 2.2. The reduced k value is attributed to a larger proportion of porous material in the layer, yet the film still had the hardness, stiffness, low water absorption and smoothness required for further damascene processing as is the current state of the art.

Accordingly, the applicants have determined a structure for a layer or film which gives a significant reduction in the dielectric constant below that of the material from which the film is formed, whilst having sufficient mechanical strength at the upper surface to accommodate many of the processes which have to be carried out during the manufacture of semi-conductors and other silicon based devices.

It has been determined that the material is particularly suitable for use with chemical mechanical polishing, which means that it is extremely beneficial in connection with dual damascene fabrication processes, which are the currently preferred approach for devices using copper for their metallisation. The combination of this particularly low k material with the low resistivity of copper is very powerful when looked at in the light of current design constraints in this area.

Although a particular method of forming the porosity in the layer has been described above, the invention is not limited to that particular method, but incorporates any dielectric layer having a structure set out above.

In the above description a dielectric material has been described, in which there are a number of zones and, in some of the zones there are pores of specified size ranges.

In the work described up until this point those specified dimensions were measured, in practice, by Transmission Electron Microscopy (TEM) analysis, by adjusting the point of focus. This is considered an accurate, repeatable and reproducible technique for the estimation of size of very small features. The same material of greater thickness, being of about 1 micron thick has been subjected to analysis using positron annihilation spectroscopy which also indicates that the pores are bigger at the bottom than at the top and indicates that the pore sizes range, in the samples tested, between 2 and 5 nanometers. If one takes into account the errors in such measurement techniques, these two results are not incompatible, but it may be less ambiguous to state that in the intermediate zone at least the majority of pores have diameters of 2 nanometers or less. Indeed, from another aspect the invention may include a layer of dielectric material formed on the substrate the layer having an atomically smooth surface zone, spaced from the substrate, and a porous portion between the surface zone and the substrate wherein the average diameter of the pores decreases in the direction of the surface zone. It will be understood that this construct will give the combination of low dielectric constant and surface mechanical stability that is desired in a number of applications.

By way of further experimentation a layer was deposited by reacting tetramethyl silane, oxygen with helium as the carrier gas using the same process conditions and gas flows. The film was then hydrogen treated as before. The results were surprising. It was found that the resultant dielectric constant value was considerably higher at 3.03 when using helium compared to 2.26 when using nitrogen both nitrogen and helium are considered to be chemically inert in plasma processing which is why they are sued and specified as 'carrier ' gasses, however it is clear that either nitrogen promotes or assists the necessary reactions that lead to the porous layer described here, or that helium suppresses these reactions.

What is claimed is:

1. A semiconductor device comprising a layer of a dielectric organo silicon dioxide type material formed on a substrate, wherein said layer is at least partially defined by:
   (a) a base zone, adjacent the substrate, having individual and discrete pores of respectively given diameters distributed therein;
   (b) an atomically smooth surface zone, spaced from the substrate; and
   (c) an intermediate zone located between the base zone and the atomically smooth surface and having individual and discrete pores of respectively given diameters distributed therein, wherein the pores in the intermediate and/or the base zone have smaller diameters the nearer they are to a surface of the atomically smooth surface zone.

2. A semiconductor device as claimed in claim 1 in which at least the majority of the pores in the base zone have diameters in the range 1–10 nm and at least the majority of the pores in the intermediate zone have diameters $\leq 2$ nm so that there is a general reduction in pore size from the bottom of the layer towards the top.

3. A semiconductor device as claimed in claim 1 wherein the base zone constitutes approximately 50% of the depth of the layer.

4. A semiconductor device as claimed in claim 1 wherein the intermediate zone constitutes approximately 40% of the depth of the layer.

5. A semiconductor device as claimed in claim 1 wherein the change in pore size is progressive from bottom to top.

6. A semiconductor device as claimed in claim 1 wherein the pores in the base zone have diameters in the range 1–4 nm.

7. A semiconductor device as claimed in claim 1 wherein the pores in the intermediate zone have diameters <1 nm.

8. A semiconductor device as claimed in claim 1 having a dielectric constant <2.5.

9. A semiconductor device as claimed in claim 1 wherein the dielectric constant of the dielectric organo silicon dioxide type material, when in a fully dense form, is >2.5.

10. A semiconductor device as claimed in claim 1, wherein the dielectric material is a carbon containing hydrogenated silicon dioxide type.

11. A semiconductor device as claimed in claim 1 wherein the layer has been chemically vapour deposited on the substrate.

12. A semiconductor device as claimed in claim 1 wherein the layer has been chemically vapour deposited from a gas mix of tetramethyl silane, oxygen and nitrogen.

13. A semiconductor device as claimed in claim 1 wherein the layer has been treated with a $H_2$ or $H_2$ containing plasma.

14. A semiconductor device as claimed in claim 13 wherein the treatment time is approximately 1 minute per 1 nm thickness of film.

15. A semiconductor device as claimed in claim 13 wherein a chemically depleted layer formed on the upper surface by the hydrogen treatment is etched away to expose the surface zone.

16. A semiconductor device as claimed in claim 1 wherein the hardness at the surface is greater than the hardness of the intermediate zone.

17. A semiconductor device comprising a layer of a dielectric organo silicon dioxide type material formed on a substrate, wherein said layer is at least partially defined by an atomically smooth surface zone, spaced from the substrate, and a porous portion located between the surface zone and the substrate and having individual and discrete pores of respectively given diameters distributed therein, wherein the average diameter of the pores decreases in the direction towards the surface zone.

18. A semiconductor device as claimed in claim 17 wherein the layer forms part of a dual damascene structure.

19. A semiconductor device as claimed in claim 18 wherein the metallization in the dual damascene structure is predominately copper.

* * * * *